US011664392B2

(12) United States Patent
Tian et al.

(10) Patent No.: US 11,664,392 B2
(45) Date of Patent: May 30, 2023

(54) FLEXIBLE ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Xueyan Tian, Beijing (CN); Shiming Shi, Beijing (CN); Shuangliang Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1017 days.

(21) Appl. No.: 16/337,557

(22) PCT Filed: Oct. 15, 2018

(86) PCT No.: PCT/CN2018/110280
§ 371 (c)(1),
(2) Date: Mar. 28, 2019

(87) PCT Pub. No.: WO2019/114399
PCT Pub. Date: Jun. 20, 2019

(65) Prior Publication Data
US 2021/0375955 A1 Dec. 2, 2021

(30) Foreign Application Priority Data
Dec. 14, 2017 (CN) .......................... 201711341653.6

(51) Int. Cl.
*H01L 27/12* (2006.01)
*H01L 29/786* (2006.01)
(Continued)

(52) U.S. Cl.
CPC ...... *H01L 27/1266* (2013.01); *H01L 27/3272* (2013.01); *H01L 29/78633* (2013.01);
(Continued)

(58) Field of Classification Search
CPC ............ H01L 27/1266; H01L 27/3272; H01L 29/78633; H01L 51/56; H01L 27/1218;
(Continued)

(56) References Cited

U.S. PATENT DOCUMENTS 9,337,212 B2  5/2016  Chen et al.
9,905,493 B2  2/2018  Li et al.
(Continued)

FOREIGN PATENT DOCUMENTS

CN   1842232 A    10/2006
CN   103474583 A  12/2013
(Continued)

OTHER PUBLICATIONS

International Search Report and Written Opinion in corresponding International Patent Application No. PCT/CN2018/110280 dated Jan. 14, 2019. 15 pages.
(Continued)

*Primary Examiner* — David Vu
(74) *Attorney, Agent, or Firm* — Leason Ellis LLP

(57) ABSTRACT

A flexible array substrate, a manufacturing method thereof and a display device are provided. The flexible array substrate includes: a first flexible substrate with a first surface; a thin film transistor on the first surface; and a light-shielding layer between the first flexible substrate and the thin film transistor. An orthographic projection of the light-shielding layer on the first flexible substrate covers an orthographic projection of a channel region of the thin film transistor on the first flexible substrate.

15 Claims, 11 Drawing Sheets

(51) Int. Cl.
*H10K 59/126* (2023.01)
*H01L 27/32* (2006.01)
*H01L 51/56* (2006.01)

(52) U.S. Cl.
CPC .......... *H01L 51/56* (2013.01); *H01L 27/1218* (2013.01); *H01L 2227/323* (2013.01); *H01L 2227/326* (2013.01); *H01L 2251/5338* (2013.01)

(58) Field of Classification Search
CPC ......... H01L 2227/323; H01L 2227/326; H01L 2251/5338; H01L 51/0097; H01L 51/003
See application file for complete search history.

(56) References Cited

U.S. PATENT DOCUMENTS

| | | | |
|---|---|---|---|
| 2003/0117059 A1* | 6/2003 | Koo | H01L 27/3265 445/24 |
| 2006/0246360 A1* | 11/2006 | Hwang | H01L 29/78633 257/E27.111 |
| 2007/0004308 A1 | 1/2007 | Chang et al. | |
| 2014/0183476 A1* | 7/2014 | Kwon | H01L 31/036 257/43 |
| 2016/0197293 A1 | 7/2016 | Chen et al. | |
| 2018/0090617 A1* | 3/2018 | Youn | H01L 29/78618 |

FOREIGN PATENT DOCUMENTS

| | | |
|---|---|---|
| CN | 103500745 A | 1/2014 |
| CN | 104064685 A | 9/2014 |
| CN | 105572991 A | 5/2016 |
| CN | 107195643 A | 9/2017 |
| CN | 107256872 | 10/2017 |
| CN | 108054186 A | 5/2018 |

OTHER PUBLICATIONS

Chinese Office Action dated May 7, 2020 corresponding Chinese Patent Application No. 201711341653.6; 19 pages.

* cited by examiner

FLEXIBLE ARRAY SUBSTRATE, MANUFACTURING METHOD THEREOF AND DISPLAY DEVICE

CROSS-REFERENCE TO RELATED PATENT APPLICATIONS

This application is a U.S. National Stage Application under 35 U.S.C. § 371 of International Patent Application No. PCT/CN2018/110280, filed Oct. 15, 2018, which claims the benefit of priority of Chinese patent application No. 201711341653.6 field on Dec. 14, 2017, both of which are incorporated by reference in their entireties as a part of the present application.

TECHNICAL FIELD

Embodiments of the present disclosure relate to a flexible array substrate, a manufacturing method thereof and a display device.

BACKGROUND

Flexible active matrix organic light-emitting diode (AMOLED) displays have advantages of high image quality, short response time to moving images, low power consumption, wide viewing angle, being ultra-thin and light and the like, and thus become the best choice for future display technology.

SUMMARY

According to the embodiments of the present disclosure, a flexible array substrate is provided. The flexible array substrate includes: a first flexible substrate including a first surface; a thin film transistor on the first surface; a light-shielding layer between the first flexible substrate and the thin film transistor. An orthographic projection of the light-shielding layer on the first flexible substrate covers an orthographic projection of a channel region of the thin film transistor on the first flexible substrate.

For example, the orthographic projection of the light-shielding layer on the first flexible substrate covers an orthographic projection of an active layer of the thin film transistor on the first flexible substrate.

For example, the flexible array substrate further includes: a buffer layer between the light-shielding layer and the thin film transistor.

For example, the flexible array substrate further includes: a first barrier layer. The light-shielding layer is at at least one of two positions as follows: a position between the first flexible substrate and the first barrier layer; and a position between the first barrier layer and the buffer layer.

For example, the flexible array substrate further includes: a first barrier layer between the first flexible substrate and the buffer layer; a second flexible substrate on a side of the first barrier layer facing the thin film transistor; and a second barrier layer on a side of the second flexible substrate facing the thin film transistor.

For example, the light-shielding layer is at at least one of a plurality of positions as follows: a position between the first flexible substrate and the first barrier layer; a position between the first barrier layer and the second flexible substrate; a position between the second flexible substrate and the second barrier layer; and a position between the second barrier layer and the buffer layer.

For example, the first barrier layer includes: a first barrier sub-layer on a side of the first flexible substrate facing the thin film transistor; a second barrier sub-layer on a side of the first barrier sub-layer facing the thin film transistor. The light-shielding layer is at at least one of a plurality of positions as follows: a position between the first flexible substrate and the first barrier layer; a position between the first barrier layer and the second flexible substrate; a position between the second flexible substrate and the second barrier layer; a position between the second barrier layer and the buffer layer; and a position between the first barrier sub-layer and the second barrier sub-layer.

For example, a material of the second barrier sub-layer is amorphous silicon.

For example, a material of the light-shielding layer is molybdenum.

According to the embodiments of the present disclosure, a display device is provided. The display device includes the flexible array substrate as described above.

According to the embodiments of the present disclosure, a manufacturing method of a flexible array substrate is provided. The method includes: forming a rigid substrate including a second surface; forming a first flexible substrate which is on the second surface; forming a thin film transistor which is on a side of the first flexible substrate facing away from the rigid substrate; forming a light-shielding layer which is between the first flexible substrate and the thin film transistor, wherein an orthographic projection of the light-shielding layer on the first flexible substrate covers an orthographic projection of a channel region of the thin film transistor on the first flexible substrate.

For example, the method further includes: forming a buffer layer which is between the light-shielding layer and the thin film transistor.

For example, the method further includes: forming a first barrier layer. The light-shielding layer is at at least one of two locations as follows: a position between the first flexible substrate and the first barrier layer; and a position between the first barrier layer and the buffer layer.

For example, the method further includes: forming a first barrier layer; and forming a second flexible substrate and a second barrier layer. The first barrier layer is between the first flexible substrate and the buffer layer; the second flexible substrate is on a side of the first barrier layer facing away from the rigid substrate; the second barrier layer is on a side of the second flexible substrate facing away from the rigid substrate.

For example, the light-shielding layer is at at least one of a plurality of positions as follows: a position between the first flexible substrate and the first barrier layer; a position between the first barrier layer and the second flexible substrate; a position between the second flexible substrate and the second barrier layer; and a position between the second barrier layer and the buffer layer.

For example, the first barrier layer includes: a first barrier sub-layer which is on a side of the first flexible substrate facing away from the rigid substrate; and a second barrier sub-layer which is on a side of the first barrier sub-layer facing away from the rigid substrate. The light-shielding layer is at at least one of a plurality of positions as follows: a position between the first flexible substrate and the first barrier layer; a position between the first barrier layer and the second flexible substrate; a position between the second flexible substrate and the second barrier layer; a position between the second barrier layer and the buffer layer; and a position between the first barrier sub-layer and the second barrier sub-layer.

For example, the method further includes: lift-offing and removing the rigid substrate by using laser light.

For example, a plurality of light-shielding layers are provided, and an interval between adjacent two ones of the plurality of light-shielding layers is greater than a wavelength of the laser light.

For example, the interval between the adjacent two ones of the plurality of light-shielding layers is not less than twice of the wavelength of the laser light.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
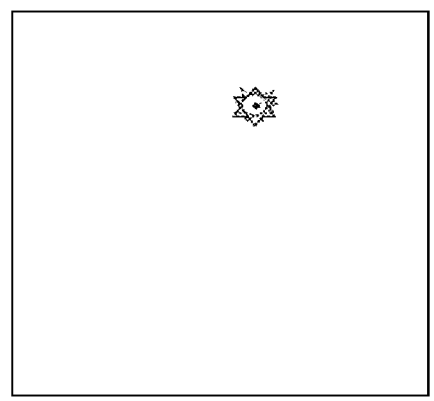
FIG. 1 shows a display screen mura caused by laser light used in LLO according to one technique.

For example, a manufacturing process of a flexible array substrate is as follows: forming a flexible substrate on a rigid substrate, forming a series of structures and components such as thin film transistors on the flexible substrate, and then lifting off the rigid substrate by laser lift-off (LLO). The flexible substrate after being lift off from the rigid substrate together with the series of structures and components such as the thin film transistors form the flexible array substrate. In the above manufacturing process, the rigid substrate has a support function. However, in lifting off the rigid substrate by laser light, the laser light may be irradiated onto channels of the thin film transistors, resulting in low gray scale display mura, linear mura, overall mura or the like, with reference to FIG. 1.

For example, a light-shielding layer is directly disposed on the rigid substrate for preventing the laser light used in the LLO from being irradiated onto the channels, so as to avoid the above various types of mura and improve the display effect. However, in this case, the following defects may exist: in lifting off the rigid substrate, the high-power ultraviolet laser light used in the LLO scans the entire rigid substrate, and a temperature of the rigid substrate becomes very high and reaches thousands of degrees in an instant; the light-shielding layer is formed of a metal material and directly provided on the rigid substrate, so the rigid substrate softens at the high temperature to cause the light-shielding layer to be contaminated, melted or peeled off, and finally directly cause the product to be discarded, which greatly affects the yield and the output rate of the product.

The inventors have found that in the manufacturing process of the flexible array substrate, by providing the light-shielding layer between the flexible substrate and the thin film transistors, in using the laser light to scan and lift off the rigid substrate, the entire energy of the laser light is quickly absorbed by the flexible substrate, chemical bonds in a material for forming the flexible substrate are broken by absorbing the energy of the laser light, so that the flexible substrate is separated from the rigid substrate, and molecules that are in the material of the flexible substrate material and are directly connected with the rigid substrate remain on the rigid substrate, whereby the flexible substrate is not contaminated due to the softening of the rigid substrate under the high temperature, thereby improving the product yield and output rate.

Figure 2:
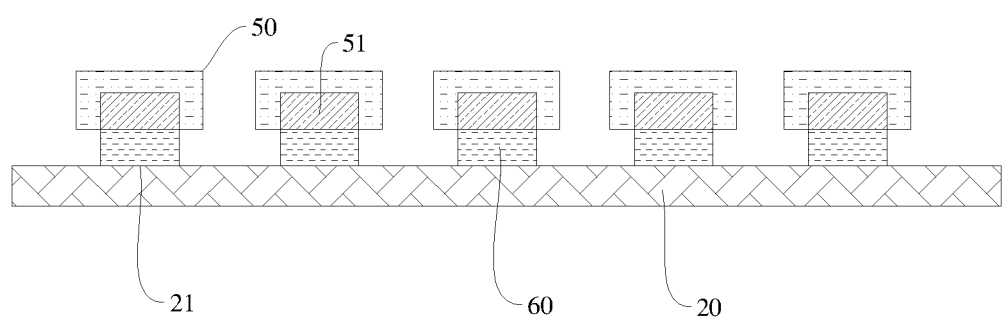
FIG. 2 is a schematic structural view of a flexible array substrate according to embodiments of the present disclosure.

According to the embodiments of the present disclosure, a flexible array substrate is provided. For example, referring to FIG. 2, the flexible array substrate includes: a first flexible substrate 20 having a first surface 21; a thin film transistor 50 on the first surface 21; and a light-shielding layer 60 between the first flexible substrate 20 and the thin film transistor 50. An orthographic projection of the light-shielding layer 60 on the first flexible substrate 20 covers an orthographic projection of a channel region 51 of the thin film transistor 50 on the first flexible substrate 20. For example, the orthographic projection of the channel region 51 of the thin film transistor 50 on the first flexible substrate 20 is entirely within the orthographic projection of the light-shielding layer 60 on the first flexible substrate 20.

According to the embodiments of the present disclosure, in a direction perpendicular to the first flexible substrate 20, the number of the light-shielding layer is not limited, one layer of the light-shielding layer may be disposed or a plurality of layers of the light-shielding layers may be disposed. The plurality of layers of the light-shielding layers may be laminated and directly contacted, or at least a part of the plurality of layers of the light-shielding layers may be distributed between different structural layers of the flexible array substrate.

Therefore, compared with the case where the light-shielding layer is directly disposed between the rigid substrate (not shown) and the first flexible substrate, the embodiments of the disclosure provide the light-shielding layer between the first flexible substrate and the thin film transistor; in using the laser light to scan and lift off the rigid substrate, most or even all of the energy of the laser light is quickly absorbed by the first flexible substrate, chemical bonds in the material for forming the first flexible substrate are broken by absorbing the energy of the laser light, and molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, and solving the technical problem that contamination, melting or peeling off of the light-shielding layer caused by the softening of the rigid substrate under the high temperature causes the product to be discarded.

In addition, the flexible array substrate ensures that the mura caused by the LLO laser light is minimized to reduce the display mura visual defect caused by the LLO mura and thereby solve the mura problem caused by the LLO laser light, thus the flexible array substrate is suitable for high resolution and high quality requirements products, and further ensures that metal ions in the light-shielding layer do not diffuse into the channel region so as to reduce defect centers and inhibit the generation of a leakage current.

According to the embodiments of the present disclosure, in order to better block the LLO laser light from being irradiated onto the channel region to further improve the TFT (thin film transistor) characteristics, the orthographic projection of the light-shielding layer on the first flexible substrate covers an orthographic projection of an active layer of the thin film transistor on the first flexible substrate. For example, the orthographic projection of the active layer of the thin film transistor on the first flexible substrate is entirely within the orthographic projection of the light-shielding layer on the first flexible substrate. Thereby, the TFT characteristics is improved, and the mura problem caused by the LLO laser light is better solved.

Figure 3:
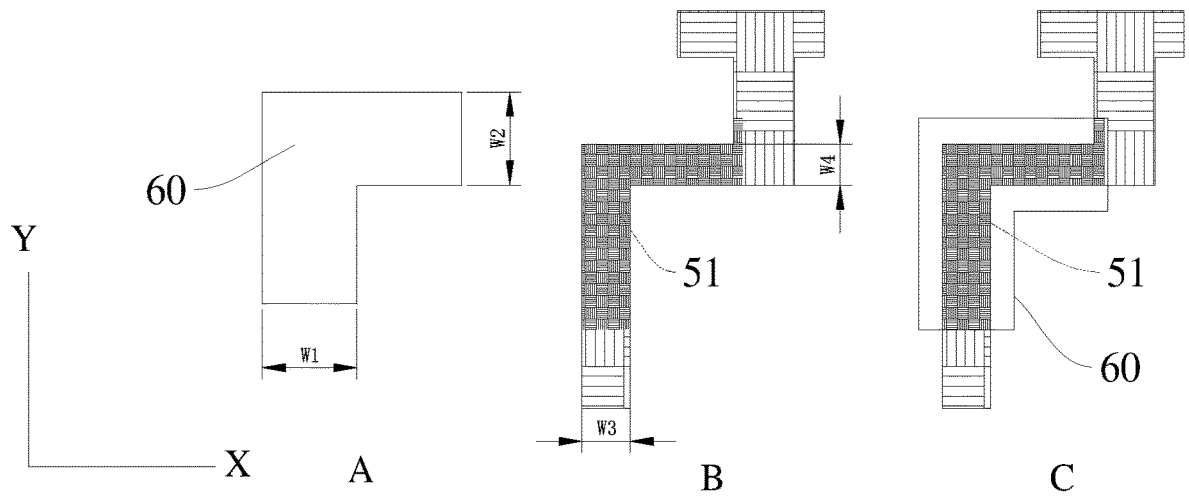
FIG. 3 is a schematic structural view of a positional relationship between a light-shielding layer and a channel region according to the embodiments of the present disclosure.

According to the embodiments of the present disclosure, the pattern and size design of the light-shielding layer are not limited as long as the orthographic projection of the light-shielding layer on the first flexible substrate covers the orthographic projection of the channel region of the thin film transistor on the first flexible substrate. In some embodiments of the present disclosure, referring to FIG. 3, A in FIG. 3 represents a pattern of the light-shielding layer 60, B in FIG. 3 represents the active layer including the channel region 51, and C in FIG. 3 represents a positional relationship (top view) of the light-shielding layer 60 and the active layer with the channel region; as can be seen from C in FIG. 3, the light-shielding layer 60 covers the channel region 51, that is, a size of the channel region is smaller than a size of the light-shielding layer. For example, in a situation where a width W3 and a width W4 of the channel region 51 respectively in X direction and Y direction are 4 μm (microns), a width W1 and a width W2 of the light-shielding layer 60 respectively in the X direction and the Y direction are 8 μm, 6 μm or 4 μm. Therefore, the design scheme of the light-shielding layer is flexible and the limitation thereof is small.

For example, a plurality of thin film transistors 50 are on the first flexible substrate 20, and accordingly, a plurality of light-shielding layers 60 are also provided. For example, an interval between adjacent light-shielding layers 60 is greater than a wavelength of the laser light used in the LLO, for example, the interval between adjacent light-shielding layers 60 is not less than twice of the wavelength of the laser light. For example, the light-shielding layers 60 are arranged in an array, the interval between adjacent light-shielding layers 60 is in micron dimension, and the wavelength of the laser light of the LLO is 308 nanometers, that is, the interval between adjacent light-shielding layers 60 is much larger than the wavelength of the laser light, so the array of the light-shielding layers 60 does not cause diffraction.

According to the embodiments of the present disclosure, the material and method for forming the light-shielding layer 60 are not limited, and those skilled in the art may flexibly select according to actual conditions. In some embodiments of the present disclosure, the material for forming the light-shielding layer is a metal or an alloy, such as metal molybdenum (Mo). In this way, the service performance is better, and the shielding effect on the LLO laser light is better.

In some embodiments of the present disclosure, the method for forming the light-shielding layer includes, but is not limited to, chemical vapor deposition or physical vapor deposition, such as magnetron sputtering.

According to the embodiments of the present disclosure, the material for forming the first flexible substrate is not limited, and those skilled in the art may flexibly select according to actual needs. In some embodiments of the present disclosure, the material for forming the first flexible substrate includes, but is not limited to, polyimide, polyether-ether-ketone, or polyester. As a result, the material is widely available, the cost is low, and the use effect is good.

According to the embodiments of the present disclosure, the specific structure of the TFT is not limited. For example, the TFT is a TFT having a top gate structure, a TFT having a bottom gate structure, a TFT having a back channel etch type (BCE) structure, or a TFT having an etch barrier layer (ESL) structure. Thus, the arrangement of the light-shielding layer described above is applicable to TFTs of various structures.

According to the embodiments of the present disclosure, the material for forming the channel region and the active layer is not limited, and those skilled in the art may flexibly select according to actual needs. In some embodiment of the present disclosure, various oxides, silicon materials, and organic materials may be used as the material for forming the active layer. For example, the material for forming the active layer includes, but is not limited to, amorphous indium gallium zinc oxide (a-IGZO), zinc oxynitride (ZnON), indium zinc tin oxide (IZTO), amorphous silicon (a-Si), polysilicon (p-Si), hexathiophene or polythiophene. As a result, the material is widely available, the cost is low, and the use effect is good.

Figure 4:
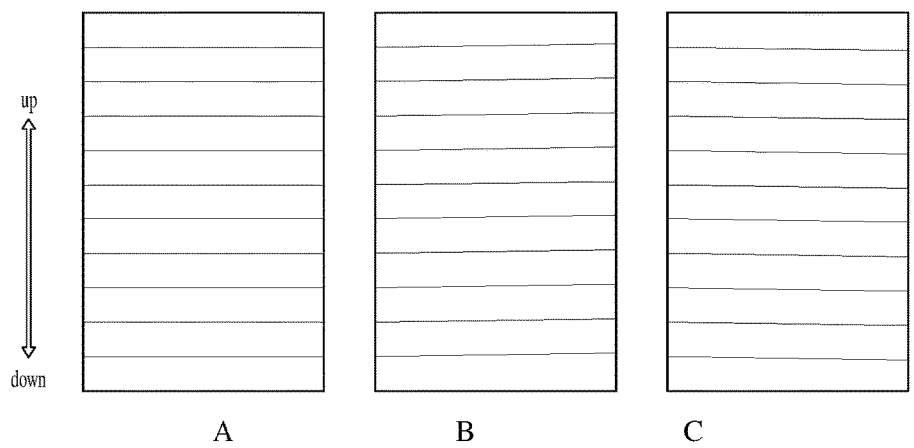
FIG. 4 shows the display screen mura resulting from interference between the LLO laser light and ELA laser light according to one technique.

For example, in a situation where the material for forming the channel region is the polysilicon, an amorphous silicon layer is firstly formed and then the amorphous silicon layer is converted into a polysilicon layer by excimer laser annealing (ELA). In manufacturing the flexible array substrate, the polysilicon layer is obtained by using ELA linear laser light on a front side and the rigid substrate is lifted off by using the LLO linear laser light on a back side. The ELA laser light and the LLO laser light may interact with each other, finally causing the ELA laser light and the LLO laser light to interfere with each other, and thus the mura with a periodic and fixed interval occurs. Referring to FIG. 4, a displayed picture (a side facing a user) has horizontal stripes with a fixed interval (A in FIG. 4), the stripes may be slightly tilted upward (B in FIG. 4) or slightly tilted downward (C in FIG. 4), and the above stripes are visible under low brightness and are apparent under low gray level, which greatly affects the display effect of the display panel. According to the embodiments of the present disclosure, the light-shielding layer is located between the first flexible substrate and the thin film transistor, which not only prevents the ELA laser light and the LLO laser light from interfering with each other so as to avoid that the display screen generates the periodic mura with the fixed interval, but also solves the technical problem that the softening of the rigid substrate under the high temperature causes the light-shielding layer to be contaminated, melted or peeled off and thus causes the product to be discarded.

According to the embodiments of the present disclosure, specific apparatuses for generating the LLO laser light and the ELA laser light are not limited, and those skilled in the art may flexibly select according to actual needs. In some embodiments of the present disclosure, for example, the laser lift-off is performed by using a xenon chloride (XeCl) excimer laser (wavelength 308 nm) or a solid state laser, and the amorphous silicon (a-Si) is annealed by using the xenon chloride (XeCl) excimer laser (wavelength 308 nm) or the solid-state laser to obtain the polysilicon. Therefore, the use effect is good and the cost is low.

Figure 5:
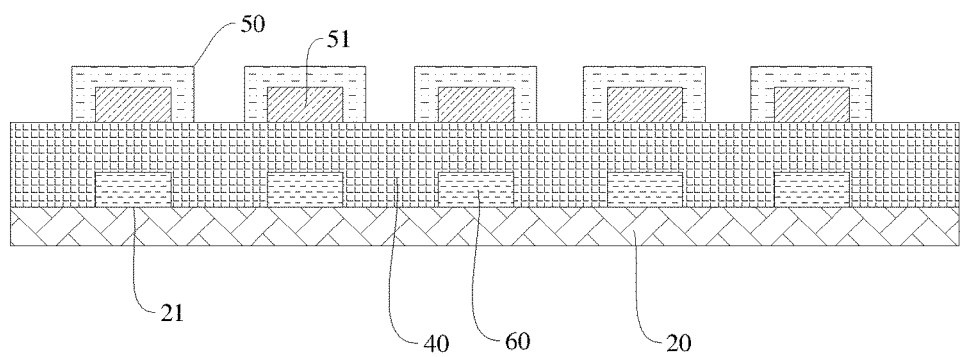
FIG. 5 is another schematic structural view of the flexible array substrate according to the embodiments of the present disclosure.

According to the embodiments of the present disclosure, in order to prevent the metal ions in the light-shielding layer from diffusing to the channel region 51 to reduce the defect centers and inhibit the generation of the leakage current, for example, the flexible array substrate further includes a buffer layer 40. Referring to FIG. 5, the buffer layer 40 is located between the light-shielding layer 60 and the thin film transistor 50. Thereby, the metal ions in the light-shielding layer 60 are effectively prevented from diffusing to the channel region 51, thereby reducing the defect centers and inhibiting the generation of the leakage current.

According to the embodiments of the present disclosure, the material and method for forming the buffer layer 40 are not limited, and those skilled in the art may flexibly select according to actual needs. In some embodiments of the present disclosure, the material for forming the buffer layer includes, but is not limited to, silicon oxide, silicon nitride, silicon oxynitride or various organic insulating materials such as a polysiloxane series material, an acrylic series material, or a polyimide series material. As a result, the material is widely available, the cost is low, and the use effect is good.

In some embodiments of the present disclosure, the method for forming the buffer layer 40 includes, but is not limited to, chemical vapor deposition (such as PECVD) or physical vapor deposition. The process is mature and easy to be industrialized.

According to the embodiments of the present disclosure, the structure of the buffer layer 40 is not limited, and those skilled in the art may flexibly select according to actual conditions. In some embodiments of the present disclosure, the structure of the buffer layer 40 includes, but is not limited to, a single layer structure or a two-layer structure. In other embodiments of the present disclosure, the buffer layer has the two-layer structure, such as $SiN_x/SiO_2$, that is, a silicon nitride layer is deposited first, and then a silicon oxide layer is deposited. Thereby, the metal ions in the light-shielding layer 60 are effectively prevented from diffusing to the channel region 51, thereby reducing the defect centers and inhibiting the generation of the leakage current.

According to the embodiments of the present disclosure, the thickness of the buffer layer 40 is not limited, and those skilled in the art may flexibly select according to actual needs. In some embodiments of the present disclosure, the buffer layer 40 has the two-layer structure. Taking the $SiN_x/SiO_2$ as an example, the silicon nitride layer has a thickness of 50 to 150 nm, and the silicon oxide layer has a thickness of 100 to 350 nm. Thereby, the metal ions in the light-shielding layer 60 are effectively prevented from diffusing to the channel region 51 to reduce the defect centers and inhibit the generation of the leakage current, without making the thickness of the entire flexible array substrate thick.

Figure 6:
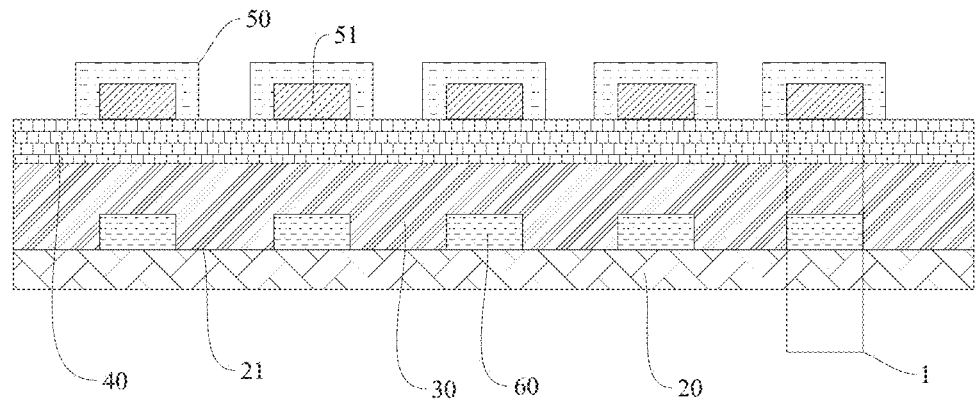
FIG. 6 is still another schematic structural view of the flexible array substrate according to the embodiments of the present disclosure.

According to the embodiments of the present disclosure, in order to further improve the service performance of the flexible array substrate, the flexible array substrate further includes a first barrier layer 30. In the embodiments of the present disclosure, the position at which the first barrier layer 30 is disposed is not limited as long as the first barrier layer 30 is located between the first flexible substrate 20 and the buffer layer 40. In some embodiments of the present disclosure, referring to FIG. 6, the first barrier layer 30 is located between the light-shielding layer 60 and the buffer layer 40. In other embodiments of the present disclosure, referring to FIG. 7, the first barrier layer 30 is located between the first flexible substrate 20 and the light-shielding layer 60. Thereby, the service performance of the flexible array substrate is well improved.

According to the embodiments of the present disclosure, the material and method for forming the first barrier layer 30 are not limited, and those skilled in the art may flexibly select according to actual needs. In some embodiments of the present disclosure, the material for forming the first barrier layer 30 includes, but is not limited to, silicon oxide, silicon nitride, silicon oxynitride or various organic insulating materials, such as polysiloxane series materials, acrylic series materials, or a polyimide series material. As a result, the material is widely available, the cost is low, and the use effect is good.

In some embodiments of the present disclosure, the method for forming the first barrier layer 30 includes, but is not limited to, chemical vapor deposition (such as PECVD) or physical vapor deposition. The process is mature and easy to be industrialized.

Figure 7:
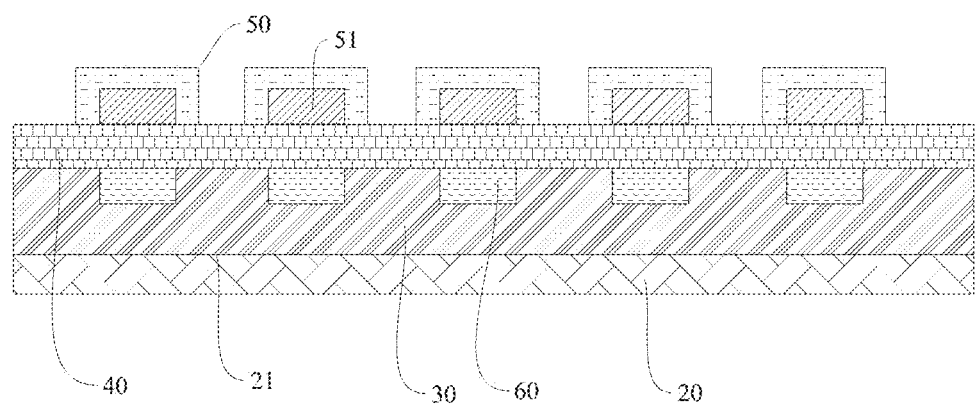
FIG. 7 is still another schematic structural view of the flexible array substrate according to the embodiments of the present disclosure.
Figure 8:
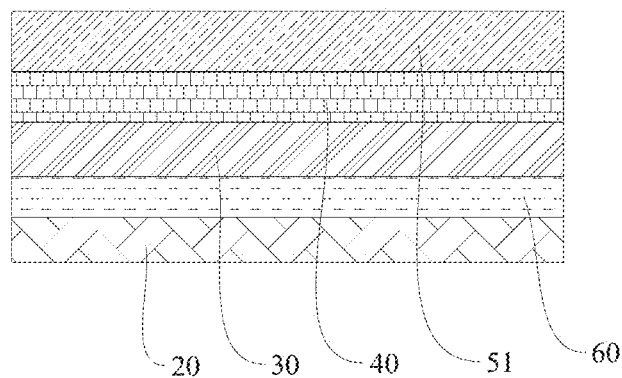
FIG. 8 is a partial structural schematic view of the flexible array substrate shown in FIG. 6.
Figure 9:
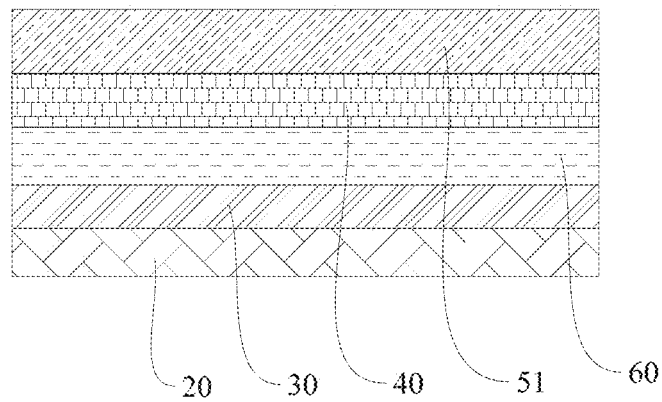
FIG. 9 is a partial structural schematic view of the flexible array substrate shown in FIG. 7.

According to the embodiments of the present disclosure, referring to FIG. 6 to FIG. 9 (FIG. 8 and FIG. 9 are respectively sectional views corresponding to one channel region 51 in FIG. 6 and FIG. 7, that is, a portion in a rectangular frame 1 in FIG. 6), the light-emitting layer 60 is located between the first flexible substrate 20 and the buffer layer 40. For example, the light-shielding layer 60 is located at at least one of the following two positions: a position between the first flexible substrate 20 and the first barrier layer 30 (FIG. 6 and FIG. 8); and a position between the first barrier layer 30 and the buffer layer 40 (FIG. 7 and FIG. 9). It can be seen that the light-shielding layer 60 may be located at the above two positions at the same time, in which case the number of the light-shielding layers 60 is two. Compared with the case of directly arranging the light-shielding layer 60 on the rigid substrate, the embodiments of the present disclosure provide the light-shielding layer 60 between the first flexible substrate 20 and the buffer layer 40, in the manufacturing process of the flexible array substrate and in using the LLO laser light to scan the rigid substrate, most or even all of the energy of the laser light is quickly absorbed by the first flexible substrate 20, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, and at least partially solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array substrate is suitable for high resolution and high quality requirements products, and ensures that the metal ions in the light-shielding layer 60 do not diffuse into the channel region 51 to reduce defect centers and inhibit the generation of the leakage current.

Figure 10:
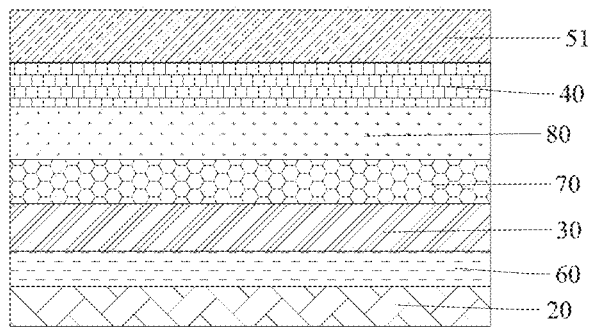
FIG. 10 is still another schematic structural view of the flexible array substrate according to the embodiments of the present disclosure.
Figure 11:
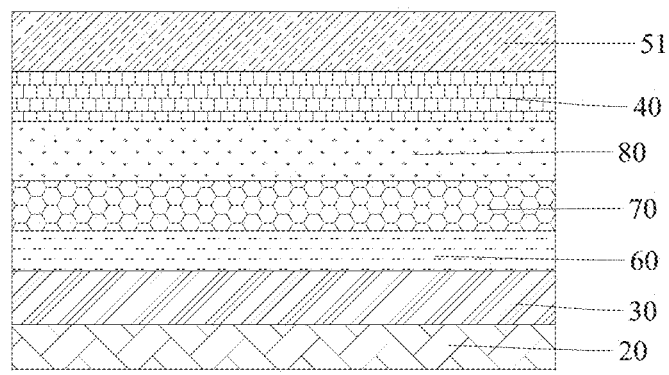
FIG. 11 is another schematic structural view of the flexible array substrate according to the embodiments of the present disclosure.
Figure 12:
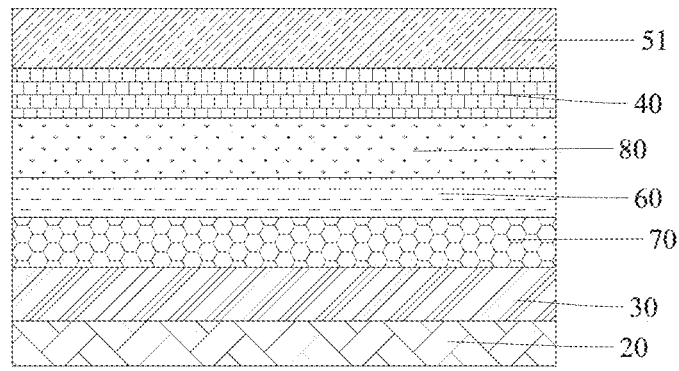
FIG. 12 is still another schematic structural view of the flexible array substrate according to the embodiments of the present disclosure.
Figure 13:
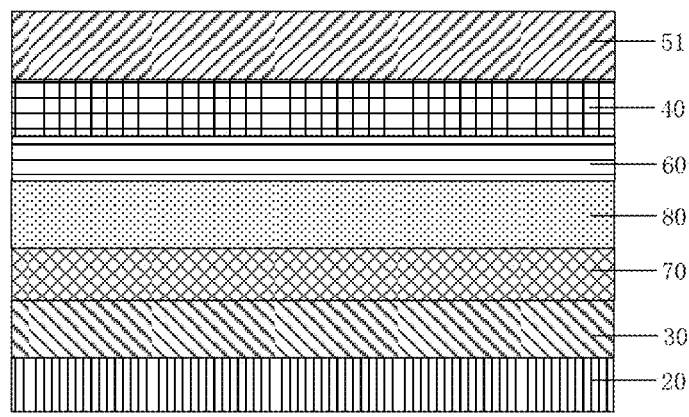
FIG. 13 is still another schematic structural view of the flexible array substrate according to the embodiments of the present disclosure.
Figure 14:
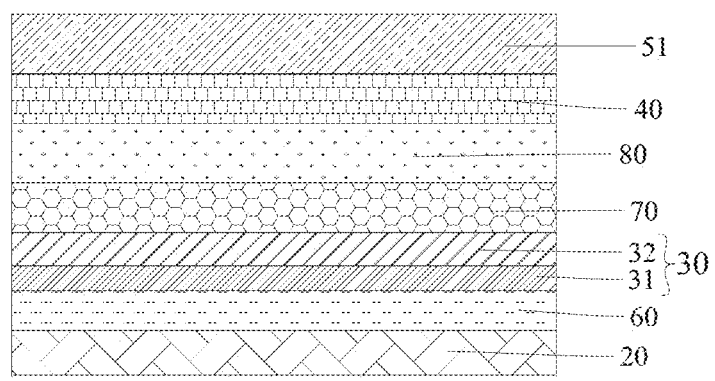
FIG. 14 is still another schematic structural view of the flexible array substrate according to the embodiments of the present disclosure.
Figure 15:
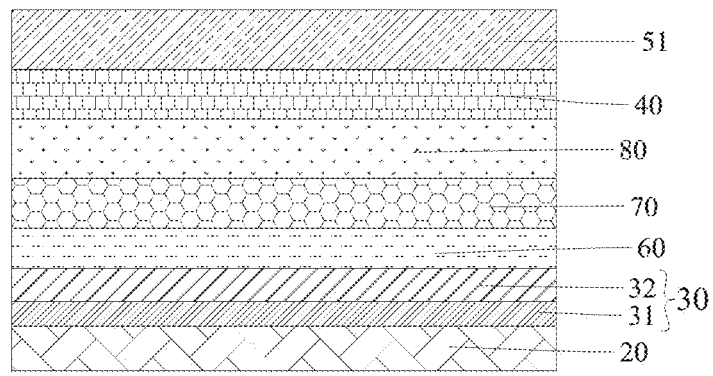
FIG. 15 is still another schematic structural view of the flexible array substrate according to the embodiments of the present disclosure.
Figure 16:
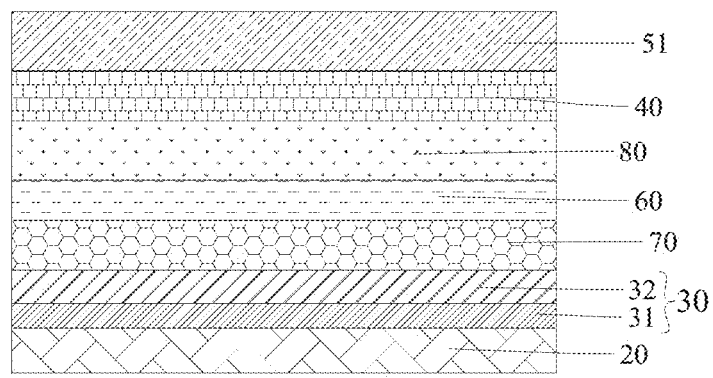
FIG. 16 is still another schematic structural view of the flexible array substrate according to the embodiments of the present disclosure.
Figure 17:
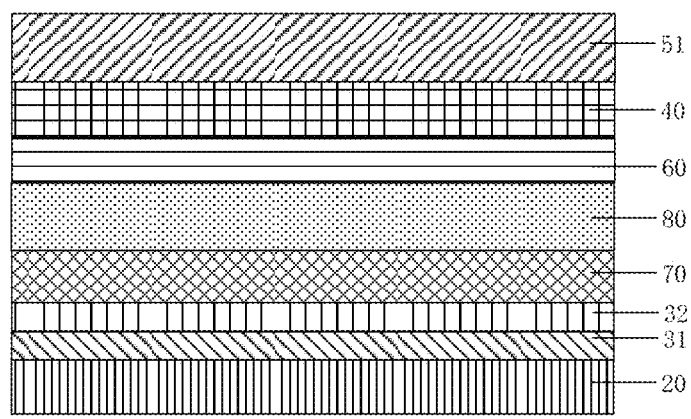
FIG. 17 is still another schematic structural view of the flexible array substrate according to the embodiments of the present disclosure.

According to the embodiments of the present disclosure, in order to further improve the electrical characteristics of the TFT, for example, the flexible array substrate further includes: a second flexible substrate 70 located on a side of the first barrier layer 30 facing the thin film transistor 50 (i.e., facing the channel region 51); and a second barrier layer 80 located on a side of the second flexible substrate 70 facing the thin film transistor 50 (i.e., facing the channel region 51). For example, in the embodiments of the present disclosure, referring to FIG. 10 to FIG. 13, the light-shielding layer 60 is located between the first flexible substrate 20 and the buffer layer 40. Further, for example, the light-shielding layer 60 is located at at least one of the following positions: the position between the first flexible substrate 20 and the first barrier layer 30 (FIG. 10); a position between the first barrier layer 30 and the second flexible substrate 70 (FIG. 11); a position between the second flexible substrate 70 and the second barrier layer 80 (FIG. 12); and a position between the second barrier layer 80 and the buffer layer 40 (FIG. 13). It can be seen that light-shielding layers 60 may be simultaneously located at two or more of the above plurality of positions, in which case the number of the light-shielding layers 60 is two or more. Compared with the case of directly arranging the light-shielding layer 60 on the rigid substrate, the embodiments of the present disclosure provide the light-shielding layer 60 between the first flexible substrate 20 and the buffer layer 40, in using the LLO laser light to scan the rigid substrate, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, namely solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array substrate is suitable for high resolution and high quality requirements products, and ensures that the metal ions in the light-shielding layer 60 do not diffuse into the channel region 51 to reduce defect centers and inhibit the generation of the leakage current.

According to the embodiments of the present disclosure, requirements on the material for forming the second barrier layer 80 is consistent with requirements on the material for forming the first barrier layer 30, and details are not described herein again.

According to the embodiments of the present disclosure, requirements on the material for forming the second flexible substrate 70 is consistent with requirements on the material for forming the first flexible substrate 20, and details are not described herein again.

According to the embodiments of the present disclosure, although only the case of the two layers of the flexible substrates is described above, those skilled in the art will readily understand that with reference to the above structure, structures of stacking more layers of the flexible substrates or stacking more layers of the barrier layers or the like and correspondingly providing the light-shielding layer are within the scope of the disclosed embodiments.

Figure 18:
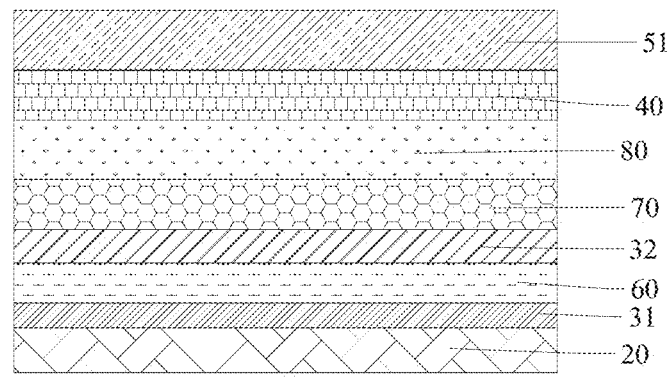
FIG. 18 is still another schematic structural view of the flexible array substrate according to the embodiments of the present disclosure.

According to the embodiments of the present disclosure, in order to increase the adhesion force between the first barrier layer 30 and the second flexible substrate 70 and improve the service performance of the flexible array substrate, referring to FIG. 14 to FIG. 18, the first barrier layer 30 includes: a first barrier sub-layer 31 located on a side of the first flexible substrate 20 facing the thin film transistor 50 (i.e., facing the channel region 51); and a second barrier sub-layer 32 located on a side of the first barrier sub-layer 31 facing the thin film transistor 50 (i.e., facing the channel region 51). For example, the light-shielding layer 60 is located at at least one of a plurality of positions in the following: the position between the first flexible substrate 20 and the first barrier layer 30 (FIG. 14); the position between the first barrier layer 30 and the second flexible substrate 70 (FIG. 15); the position between the second flexible substrate 70 and the second barrier layer 80 (FIG. 16); the position between the second barrier layer 80 and the buffer layer 40 (FIG. 17); and a position between the first barrier sub-layer 31 and the second barrier sub-layer 32 (FIG. 18). It can be seen that light-shielding layers 60 may be simultaneously located at two or more of the above plurality of positions, in which case the number of the light-shielding layers 60 is two or more. According to the embodiments of the present disclosure, the service performance of the flexible array substrate is improved. Compared with directly arranging the light-shielding layer on the rigid substrate, the embodiments of the present disclosure provide the light-shielding layer between the first flexible substrate and the buffer layer; in using the LLO laser light to scan the rigid substrate, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, namely solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array substrate is suitable for high resolution and high quality requirements products, and ensures that the metal ions in the light-shielding layer do not diffuse into the channel region to reduce defect centers and inhibit the generation of the leakage current.

According to the embodiments of the present disclosure, requirements on the material for forming the first barrier sub-layer 31 is consistent with requirements on the material for forming the first barrier layer 30, and details are not described herein again.

According to the embodiments of the present disclosure, the material for forming the second barrier sub-layer 32 is not limited, and those skilled in the art may flexibly select according to actual needs. In the embodiments of the present disclosure, the material for forming the second barrier sub-layer 32 is amorphous silicon. Thereby, the adhesion effect is good.

According to the embodiments of the present disclosure, in a situation where a flexible display screen manufactured by using the flexible array substrate described above is integrated with a back-end application, such as various mobile phone later-period integrated sensors, receivers, divergers, etc., the light-shielding layer also is used to block ultraviolet light, infrared light or visible light or the like from a light source, so as to prevent the influence of the above light on the flexible display.

According to the embodiments of the present disclosure, a display device is provided. According to the embodiments of the present disclosure, the display device includes the flexible array substrate described above. Thereby, the display device has uniform display, uniform brightness, low visual defects and high quality display. Those skilled in the art can understand that the display device has all the features and advantages of the flexible array substrate described above, and details are not described herein again.

Figure 19:
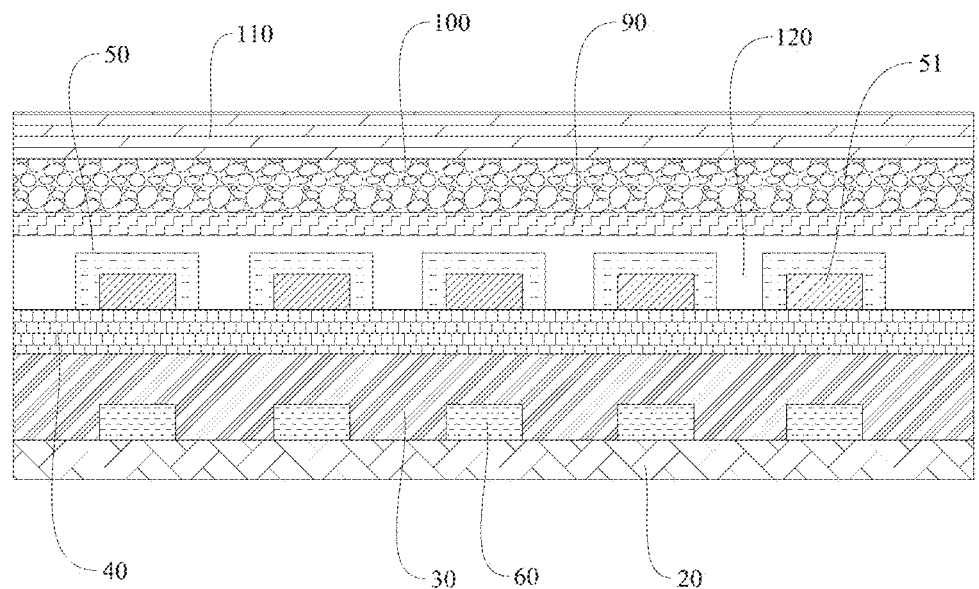
FIG. 19 is a schematic structural diagram of a display device according to the embodiments of the present disclosure.

According to some embodiments of the present disclosure, referring to FIG. 19, in addition to the flexible array substrate described above, the display device further includes a planarization layer 120 on a side of the thin film transistor facing away from the first flexible substrate 20, a light-emitter component 90 on a side of the planarization layer 120 facing away from the first flexible substrate 20, an encapsulation layer 100 on a side of the light-emitter component 90 facing away from the first flexible substrate 20, and a top protective film 110 on a side of the thin film encapsulation layer 100 facing away from the first flexible substrate 20. Thereby, the display function of the display device is achieved.

According to some embodiments of the present disclosure, the display device may be a flexible display device that implements a curved or bendable display; or the display device may be a non-flexible display device that uses the flexible array substrate described above to increase the service life of the product in the case that the product falls off or the like.

According to the embodiments of the present disclosure, the light-emitter component 90 is, for example, an organic light-emitting diode (OLED), a quantum dot light-emitting diode (QLED), or the like.

According to the embodiments of the present disclosure, the specific type of the display device is not particularly limited, and the display device may be any device or apparatus having a display function in the art, such as, but not limited to, a mobile phone, a tablet computer, a computer display, a game machine, a television, a display screen, a wearable device, or any other living appliance or household appliance with the display function.

Of course, those skilled in the art can understand that the display device described in the embodiments of the present disclosure may further include necessary structures and components of a conventional display device in addition to the flexible array substrate described above. Taking the mobile phone as an example, in addition to the flexible array substrate of the embodiments of the present disclosure, the display device may further include structures and components included by the conventional mobile phone such as a touch screen, a housing, a CPU, a camera module, a fingerprint recognition module, a sound processing system and the like, which are not described here.

Figure 20:
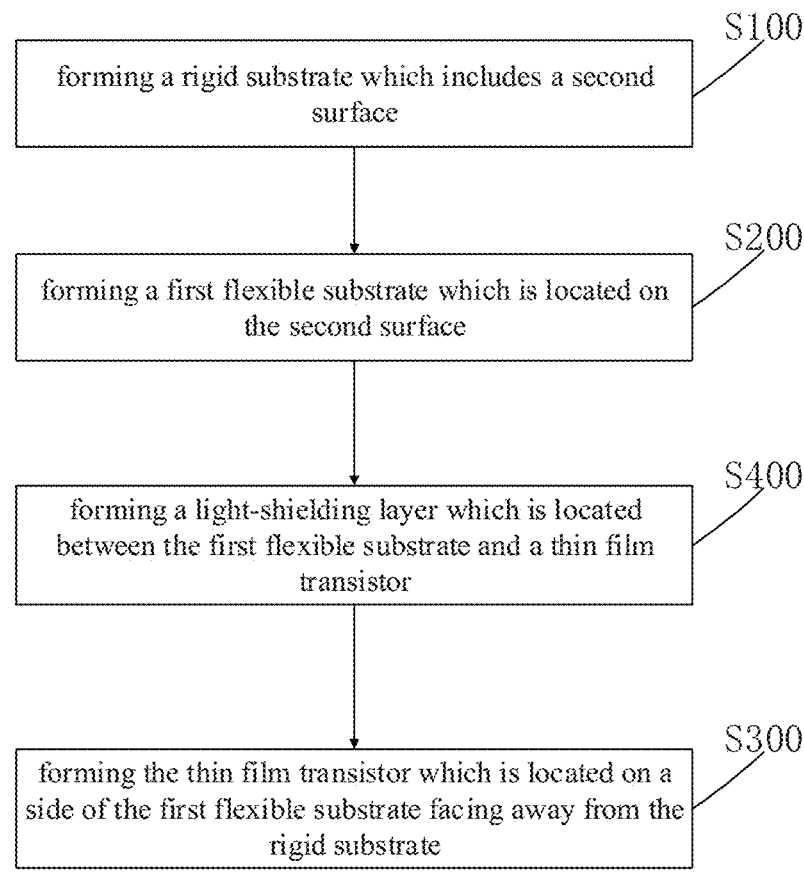
FIG. 20 is a flow diagram of a method for manufacturing the flexible array substrate according to the embodiments of the present disclosure.
Figure 21:
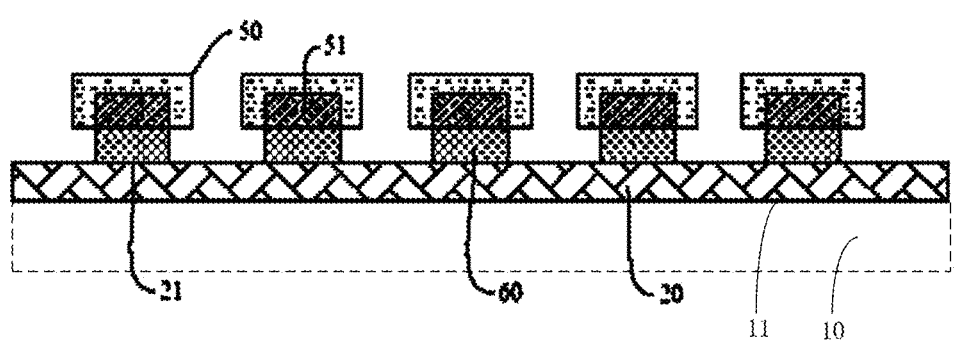
FIG. 21 is a schematic structural view after completion of a step S400 of the method according to the embodiments of the present disclosure.

According to the embodiments of the present disclosure, a manufacturing method of the flexible array substrate is provided. According to the embodiments of the present disclosure, referring to FIG. 20 and FIG. 21, the method includes the following steps.

S100: forming the rigid substrate which includes a second surface.

For example, the rigid substrate 10 is formed and the rigid substrate has the second surface 11. According to the embodiments of the present disclosure, in order to improve the product yield, the rigid substrate 10 needs to be precleaned, and a cleaning method is not limited as long as the cleanliness of the rigid substrate 10 after cleaning reaches the requirements.

According to the embodiments of the present disclosure, the specific type of the rigid substrate 10 is not limited, and those skilled in the art may flexibly select according to actual conditions. In some embodiments of the present disclosure, the type of the rigid substrate 10 include, but is not limited to, glass substrate. As a result, the source material is wide, the cost is low, and the use effect is good.

S200: forming the first flexible substrate which is located on the second surface.

According to the embodiments of the present disclosure, the method for forming the first flexible substrate 20 is not limited, and those skilled in the art may flexibly select according to actual conditions. In the embodiments of the present disclosure, the method for forming the first flexible substrate 20 includes, but is not limited to, chemical vapor deposition or physical vapor deposition. Thus, the method is simple and mature, and is easy to be industrialized.

According to the embodiments of the present disclosure, in order to facilitate the forming of subsequent film layers, the surface 21 of the first flexible substrate 20 needs to be cleaned after the first flexible substrate 20 is formed. The cleaning method is not limited as long as the cleaning method makes the first flexible substrate 20 clean and does not cause damage to the first flexible substrate 20, and those skilled in the art may flexibly choose according to actual conditions.

S300: forming the thin film transistor which is located on the side of the first flexible substrate facing away from the rigid substrate.

According to the embodiments of the present disclosure, those skilled in the art may select a forming method according to a specific structure of the thin film transistor 50, and a specific method for forming the TFT is not limited herein.

S400: forming the light-shielding layer which is located between the first flexible substrate and the thin film transistor, in which the orthographic projection of the light-shielding layer on the first flexible substrate covers the orthographic projection of the channel region of the thin film transistor on the first flexible substrate.

According to the embodiments of the present disclosure, the method for forming the light-shielding layer 60 is not limited, and those skilled in the art may flexibly select according to actual needs. In the embodiments of the present disclosure, the method for forming the light-shielding layer 60 includes, but is not limited to, chemical vapor deposition, physical vapor deposition, coating or printing, or the like. Thus, the method is simple and mature and is easy to be industrialized. In some embodiments of the present disclosure, the method for forming the light-shielding layer 60 includes: forming a light-shielding film covering the whole first flexible substrate 20, and etching the light-shielding film according to a pattern requirement for the light-shielding layer 60 to be formed, for example, a pattern of the channel region 51, to obtain the light-shielding layer 60.

According to the embodiments of the present disclosure, the manufacturing method for the flexible array substrate is simple and quick, is mature in process, and is easy to be industrialized. Compared with the case of directly arranging the light-shielding layer on the rigid substrate, the embodiments of the present disclosure provide the light-shielding layer between the first flexible substrate and the buffer layer; in using the LLO laser light to scan the rigid substrate, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, and at least partially solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array substrate is suitable for high resolution and high quality requirements products, and ensures that the metal ions in the light-shielding layer do not diffuse into the channel region to reduce the defect centers and inhibit the generation of the leakage current.

Figure 22:
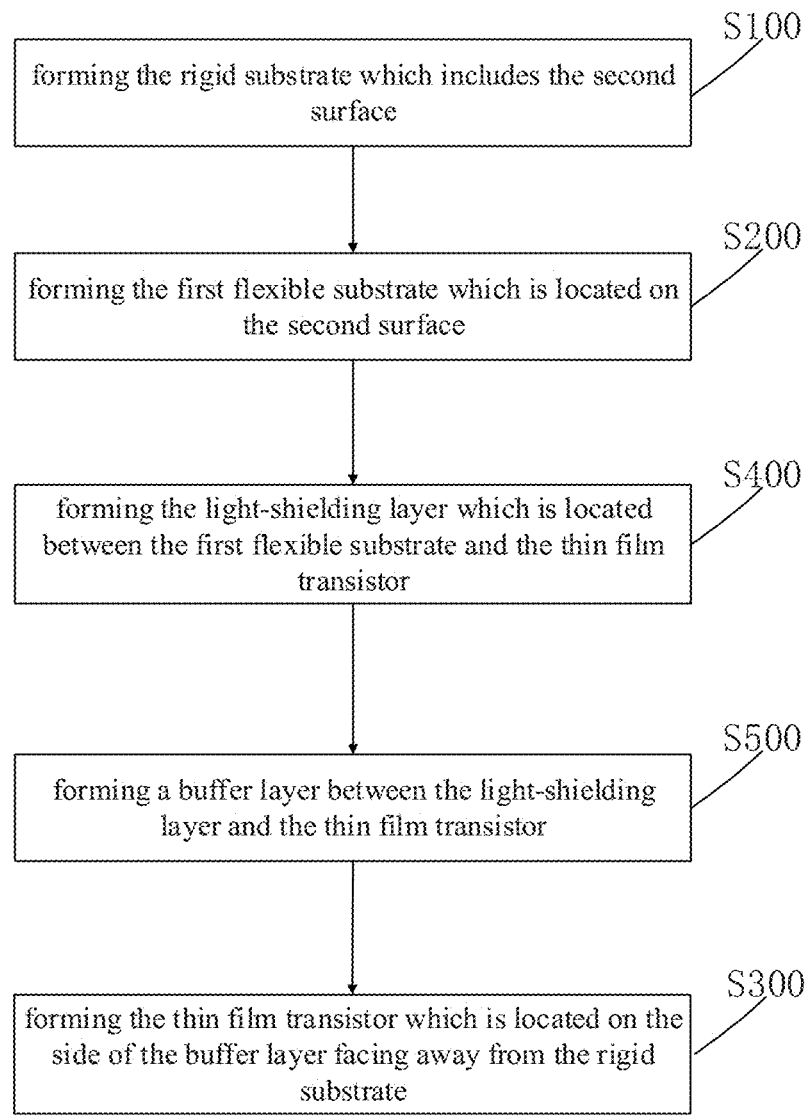
FIG. 22 is another flow diagram of the method for manufacturing the flexible array substrate according to the embodiments of the present disclosure.

According to the embodiments of the present disclosure, referring to FIG. 22, for example, the method further includes a step S500 of forming the buffer layer between the light-shielding layer and the thin film transistor, that is, the thin film transistor is located on the side of the buffer layer facing away from the first flexible substrate.

Figure 23:
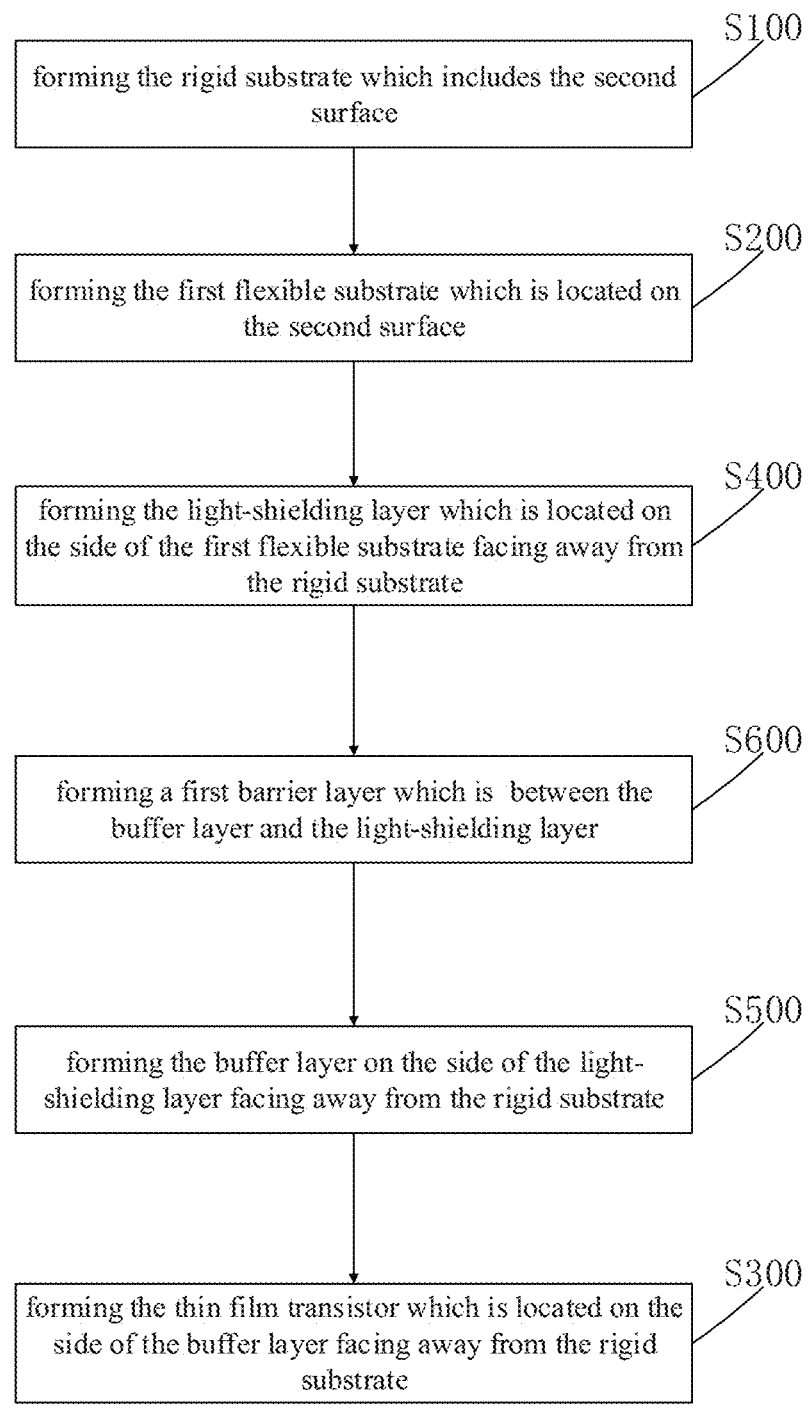
FIG. 23 is another flow diagram of the method for manufacturing the flexible array substrate according to the embodiments of the present disclosure.
Figure 24:
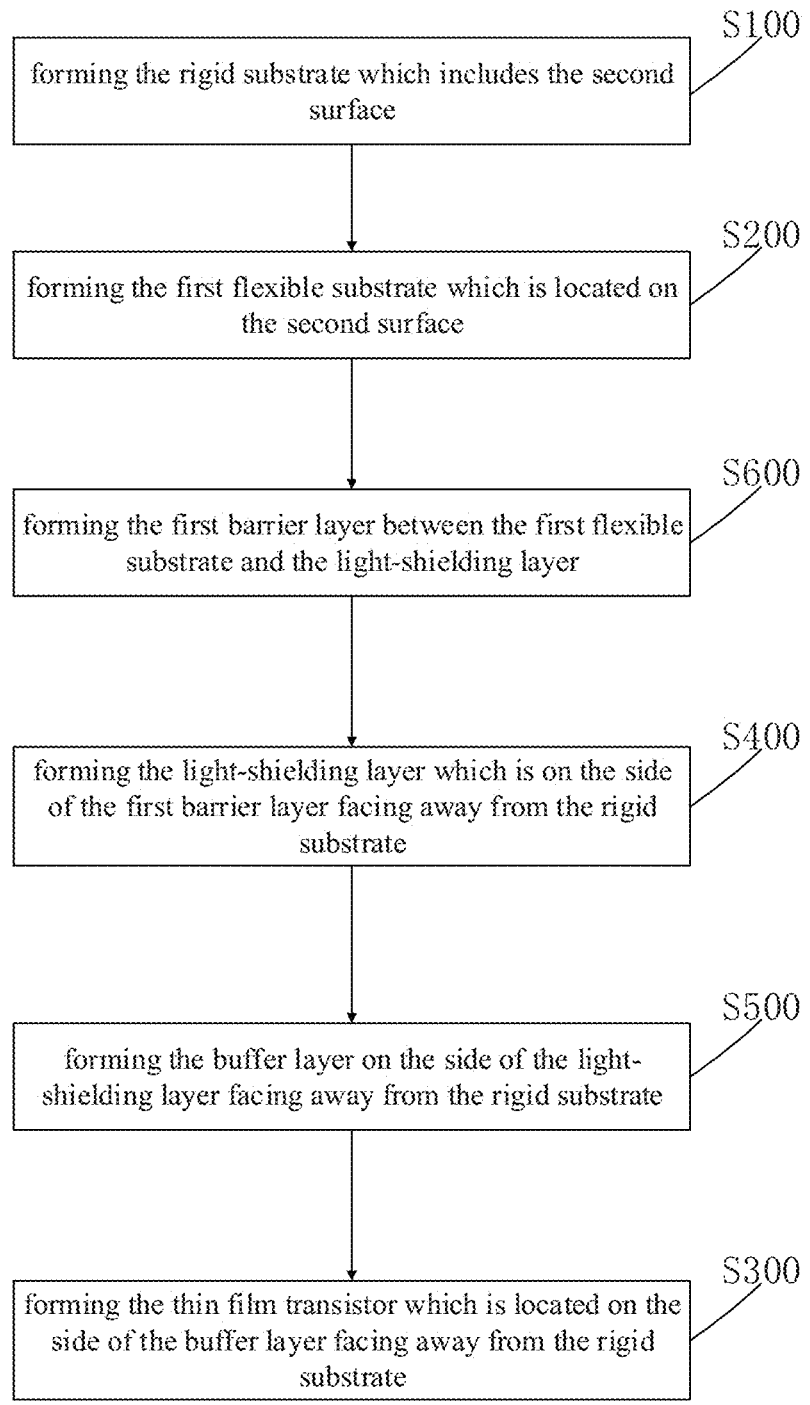
FIG. 24 is still another flow diagram of the method for manufacturing the flexible array substrate according to the embodiments of the present disclosure.

According to the embodiments of the present disclosure, for example, the above method further includes a step S600 of forming the first barrier layer. For example, the first barrier layer is located between the light-shielding layer and the buffer layer, that is, on the side of the light-shielding layer facing away from the first flexible substrate, referring to FIG. 23. For example, the first barrier layer is located between the first flexible substrate and the light-shielding layer, that is, on the side of the first flexible substrate facing away from the rigid substrate, with reference to FIG. 24.

According to the embodiments of the present disclosure, in a case where the first barrier layer is formed, the light-shielding layer is located at at least one of the following two positions: the position between the first flexible substrate and the first barrier layer; and the position between the first barrier layer and the buffer layer. It can be seen that light-shielding layers may be located at the above two positions at the same time, in which case the number of the light-shielding layers is two.

According to the embodiments of the present disclosure, the method for forming the buffer layer and the first barrier layer is not limited, and those skilled in the art may flexibly select according to actual needs. In the embodiments of the present disclosure, the method for forming the buffer layer and the first barrier layer includes, but is not limited to, chemical vapor deposition, or physical vapor deposition. Thus, the method is simple and mature, and is easy to be industrialized.

According to the embodiments of the present disclosure, the above steps S100, S200, S300, S400, S500, and S600 are not limitative to the process sequence of the manufacturing process, and those skilled in the art may select the sequence of steps of the manufacturing process according to actual conditions. For example, according to the above description, for example, the light-shielding layer is located between the first flexible substrate and the first barrier layer, that is, the light-shielding layer is located on the first flexible substrate, and the first barrier layer is located on the side of the light-shielding layer facing away from the first flexible substrate, in which case, the schematic flow chart is referred to FIG. 23, and the structural schematic views are referred to FIG. 6 and FIG. 8; and/or the light-shielding layer is located between the first barrier layer and the buffer layer, that is, the light-shielding layer is located on the side of the first barrier layer facing away from the first flexible substrate, and the buffer layer is located on the side of the light-shielding layer facing away from the first flexible substrate, in which case, the schematic flow chart is referred to FIG. 24, and the structural schematic views are referred to FIG. 7 and FIG. 9.

According to the embodiments of the present disclosure, in order to better block the LLO laser light from being irradiated to the channel and further improve the TFT characteristics, the orthographic projection of the light-shielding layer on the first flexible substrate covers the orthographic projection of the active layer of the thin film transistor on the first flexible substrate. Thereby, the TFT characteristics are improved, and the mura problem caused by the LLO is better solved.

According to the embodiments of the present disclosure, in order to further improve the electrical characteristics of the TFT, for example, the above method further includes the step of forming the second flexible substrate 70 and the second barrier layer 80 (see FIG. 10 to FIG. 13), in which the second flexible substrate 70 is located on the side of the first barrier layer 30 facing away from the first flexible substrate 20; the second barrier layer 80 is located on the side of the second flexible substrate 70 facing away from the first flexible substrate 20. In the embodiments of the present disclosure, the light-shielding layer 60 is located between the first flexible substrate 20 and the buffer layer 40. For example, referring to FIG. 10 to FIG. 13, the light-shielding layer 60 is located at at least one of a plurality of positions in the following: the position between the first flexible substrate 20 and the first barrier layer 30 (FIG. 10); the position between the first barrier layer 30 and the second flexible substrate 70 (FIG. 11); the position between the second flexible substrate 70 and the second barrier layer 80 (FIG. 12); and the position between the second barrier layer 80 and the buffer layer 40 (FIG. 13). It can be seen that light-shielding layers 60 may be simultaneously located at two or more of the above plurality of positions, in which case the number of the light-shielding layers 60 is two or more. Compared with the case of directly arranging the light-shielding layer on the rigid substrate, the embodiments of the present disclosure provide the light-shielding layer between the first flexible substrate and the buffer layer; in using the LLO laser light to scan the rigid substrate, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, namely solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array substrate is suitable for high resolution and high quality requirements products, and ensures that the metal ions in the light-shielding layer do not diffuse into the channel region to reduce the defect centers and inhibit the generation of the leakage current According to the embodiments of the present disclosure, the requirements on the method for forming the second flexible substrate is consistent with the requirements on the method for forming the first flexible substrate described above, and the requirements on the method for forming the second barrier layer is consistent with the requirements on the method for forming the first barrier layer described above, which are not described here.

According to the embodiments of the present disclosure, in order to increase the adhesion force between the first barrier layer and the second flexible substrate and improve the service performance of the flexible array substrate, referring to FIG. 14 to FIG. 18, the first barrier layer 30 includes: the first barrier sub-layer 31 which is located on the side of the first flexible substrate 20 facing away from the rigid substrate 10; and the second barrier sub-layer 32 which is located on the side of the first barrier sub-layer 31 facing away from the rigid substrate 10. In this case, the light-shielding layer 60 is located at at least one of the following positions: the position between the first flexible substrate 20 and the first barrier layer 30 (FIG. 14); the position between the first barrier layer 30 and the second flexible substrate 70 (FIG. 15); the position between the second flexible substrate 70 and the second barrier layer 80 (FIG. 16); the position between the second barrier layer 80 and the buffer layer 40 (FIG. 17); and the position between the first barrier sub-layer 31 and the second barrier sub-layer 32 (FIG. 18). It can be seen that light-shielding layers 60 may be simultaneously located at two or more of the above plurality of positions, in which case the number of the light-shielding layers 60 is two or more. According to the embodiments of the present disclosure, the service performance of the flexible array substrate is improved. Compared with the case of directly arranging the light-shielding layer on the rigid substrate, the embodiments of the present disclosure provide the light-shielding layer between the first flexible substrate and the buffer layer; in using the LLO laser light to scan the rigid substrate, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, and at least partially solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura, the flexible array is suitable for high resolution and high quality requirements products, and ensures that the metal ions in the light-shielding layer do not diffuse into the channel region to reduce the defect centers and inhibit the generation of the leakage current.

According to the embodiments of the present disclosure, the above method may be used to prepare the flexible array substrate described above, and the material and method for forming the rigid substrate, the first flexible substrate, the first barrier layer, the buffer layer, the light-shielding layer, the channel region, the second barrier layer, the second flexible substrate, the first barrier sub-layer or the second barrier sub-layer are the same as those described above, and are not further described herein.

For example, according to the embodiments of the present disclosure, after the thin film transistor is formed, for example, the above method further includes: removing the rigid substrate by using the LLO.

According to the embodiments of the present disclosure, in the situation where the material for forming the channel region is polysilicon, the specific process for forming the polysilicon layer is not limited, and those skilled in the art may flexibly select according to actual needs. In some embodiments of the present disclosure, the process of forming the polysilicon layer involves: depositing an amorphous silicon layer having a thickness of 30 to 60 nm by a plasma enhanced chemical vapor deposition (PECVD) method, then heating the amorphous silicon layer at a temperature of 400° C. to 450° C. for 0.5 to 3 hours, and finally performing an excimer laser annealing (ELA) process to obtain the polysilicon layer. Thus, the method is mature and simple, easy to operate, and easy to be industrialized.

According to the embodiments of the present disclosure, after the polysilicon layer is formed, the subsequent processes of manufacturing the array substrate are performed by using conventional techniques and processes. In the embodiments of the present disclosure, after the polysilicon layer is formed, the steps are subsequently performed: forming an active pattern, performing a channel ion implantation adjustment (Vth doping), performing a hydrofluoric acid cleaning (HF clean), forming an insulating layer (GI), performing source electrode and drain electrode doping (SD doping), forming a planarization layer (ILD, CNT), performing hydrogenation, forming the source electrode and the drain electrode (SD), forming an organic planarization layer (PLN), forming an anode (ITO), forming an organic cover layer (PDL), forming an isolation layer (PS), and so on.

According to the embodiments of the present disclosure, for example, after forming the encapsulation layer, the above method for manufacturing the flexible array substrate further includes the step of removing the rigid substrate by using the laser lift-off method, so as to finally completing the manufacture of the entire flexible array substrate. According to the above description, in removing the rigid substrate by the laser lift-off method, because the light-shielding layer is located between the first flexible substrate and the buffer layer, most or even all of the energy of the laser light is quickly absorbed by the first flexible substrate, the chemical bonds in the material for forming the first flexible substrate are broken by absorbing the energy of the laser light, and the molecules which are in the material of the first flexible substrate and are directly connected with the rigid substrate remain on the rigid substrate, so the first flexible substrate is not contaminated due to the softening of the rigid substrate under the high temperature, thereby improving the product yield and output rate, namely solving the technical problem that the contamination, melting or peeling off of the light-shielding layer caused by the softening of the rigid substrate under the high temperature causes the product to be discarded. At the same time, the flexible array substrate ensures that the mura caused by the LLO laser light is minimized to reduce the display mura visual defect caused by the LLO mura.

What are described above is related to the illustrative embodiments of the disclosure only and not limitative to the scope of the disclosure; the scopes of the disclosure are defined by the accompanying claims.

What is claimed is:

1. A flexible array substrate, comprising:
   a first flexible substrate comprising a first surface;
   a plurality of portions of a light-shielding layer on the first surface of the first flexible substrate;
   a first barrier layer on the light-shielding layer;
   a buffer layer on the first barrier layer; and
   a plurality of thin film transistors on the buffer layer;
   wherein an orthographic projection of each portion of the light-shielding layer on the first flexible substrate overlaps an orthographic projection of a corresponding channel region of a corresponding thin film transistor on the first flexible substrate, and an interval between adjacent portions of the light-shielding layer is greater than a wavelength of a laser light used in a laser light lift-off process.

2. The flexible array substrate according to claim 1, wherein
   the light-shielding layer with the plurality of portions is at at least one of two positions as follows: a position between the first flexible substrate and the first barrier layer; and a position between the first barrier layer and the buffer layer.

3. The flexible array substrate according to claim 1, further comprising:
   a second flexible substrate on a side of the first barrier layer facing the thin film transistor; and
   a second barrier layer on a side of the second flexible substrate facing the thin film transistor.

4. The flexible array substrate according to claim 3, wherein the light-shielding layer with the plurality of portions is at at least one of a plurality of positions as follows: a position between the first flexible substrate and the first barrier layer; a position between the first barrier layer and the second flexible substrate; a position between the second flexible substrate and the second barrier layer; and a position between the second barrier layer and the buffer layer.

5. The flexible array substrate according to claim 3, wherein the first barrier layer comprises:
   a first barrier sub-layer on a side of the first flexible substrate facing the thin film transistor;
   a second barrier sub-layer on a side of the first barrier sub-layer facing the thin film transistor;
   wherein the light-shielding layer with the plurality of portions is at at least one of a plurality of positions as follows: a position between the first flexible substrate and the first barrier layer; a position between the first barrier layer and the second flexible substrate; a position between the second flexible substrate and the second barrier layer; a position between the second barrier layer and the buffer layer; and a position between the first barrier sub-layer and the second barrier sub-layer.

6. The flexible array substrate according to claim 5, wherein a material of the second barrier sub-layer is amorphous silicon.

7. The flexible array substrate according to claim 1, wherein a material of the light-shielding layer is molybdenum.

8. A display device, comprising a flexible array substrate, wherein the flexible array substrate comprises:
- a first flexible substrate comprising a first surface;
- a plurality of portions of a light-shielding layer on the first surface of the first flexible substrate;
- a first barrier layer on the light-shielding layer;
- a buffer layer on the first barrier layer; and
- a plurality of thin film transistors on the buffer layer;
- wherein an orthographic projection of each portion of the light-shielding layer on the first flexible substrate overlaps an orthographic projection of a corresponding channel region of a corresponding thin film transistor on the first flexible substrate, and an interval between adjacent portions of the light-shielding layer is greater than a wavelength of a laser light used in a laser light lift-off process.

9. A manufacturing method of a flexible array substrate, comprising:
- forming a rigid substrate comprising a second surface;
- forming a first flexible substrate including a first surface, the first flexible substrate is on the second surface of the rigid substrate;
- forming a light-shielding layer with a plurality of portions on the first surface of the first flexible substrate;
- forming a first barrier layer on the light-shielding layer;
- forming a buffer layer on the first barrier layer; and
- forming a plurality of thin film transistors on the buffer layer;
- wherein an orthographic projection of each portion of the light-shielding layer on the first flexible substrate overlaps an orthographic projection of a corresponding channel region of a corresponding thin film transistor on the first flexible substrate, and an interval between adjacent portions of the light-shielding layer is greater than a wavelength of a laser light used in a laser light lift-off process.

10. The method according to claim 9, wherein the light-shielding layer with the plurality of portions is at at least one of two locations as follows: a position between the first flexible substrate and the first barrier layer; and a position between the first barrier layer and the buffer layer.

11. The method according to claim 9, further comprising: forming a second flexible substrate and a second barrier layer, wherein
- the first barrier layer is between the first flexible substrate and the buffer layer;
- the second flexible substrate is on a side of the first barrier layer facing away from the rigid substrate; and
- the second barrier layer is on a side of the second flexible substrate facing away from the rigid substrate.

12. The method according to claim 11, wherein the light-shielding layer with the plurality of portions is at at least one of a plurality of positions as follows: a position between the first flexible substrate and the first barrier layer; a position between the first barrier layer and the second flexible substrate; a position between the second flexible substrate and the second barrier layer; and a position between the second barrier layer and the buffer layer.

13. The method according to claim 11, wherein the first barrier layer comprises:
- a first barrier sub-layer which is on a side of the first flexible substrate facing away from the rigid substrate; and
- a second barrier sub-layer which is on a side of the first barrier sub-layer facing away from the rigid substrate;
- wherein the light-shielding layer with the plurality of portions is at at least one of a plurality of positions as follows: a position between the first flexible substrate and the first barrier layer; a position between the first barrier layer and the second flexible substrate; a position between the second flexible substrate and the second barrier layer; a position between the second barrier layer and the buffer layer; and a position between the first barrier sub-layer and the second barrier sub-layer.

14. The method according to claim 9, further comprising lift-offing and removing the rigid substrate by using laser light.

15. The method according to claim 9, wherein the interval between the adjacent portions of the light-shielding layers is not less than twice of the wavelength of the laser light.

* * * * *